United States Patent
Huijser

(10) Patent No.: US 8,478,356 B2
(45) Date of Patent: Jul. 2, 2013

(54) AUDIO AMPLIFIER

(75) Inventor: Jan Paulus Freerk Huijser, Wychen (NL)

(73) Assignee: NXP B.V., Eindhoven (NL)

( * ) Notice: Subject to any disclaimer, the term of this patent is extended or adjusted under 35 U.S.C. 154(b) by 57 days.

(21) Appl. No.: 13/283,174

(22) Filed: Oct. 27, 2011

(65) Prior Publication Data

US 2012/0108300 A1    May 3, 2012

(30) Foreign Application Priority Data

Oct. 28, 2010    (EP) .................................. 10189200

(51) Int. Cl.
*H04M 1/00*    (2006.01)
*H04K 3/00*    (2006.01)

(52) U.S. Cl.
USPC ........................................ 455/569.1; 381/111

(58) Field of Classification Search
USPC ................. 455/575.1, 569.1; 381/111, 120
See application file for complete search history.

(56) References Cited

U.S. PATENT DOCUMENTS

| | | | |
|---|---|---|---|
| 2006/0262945 A1* | 11/2006 | Lechner | 381/111 |
| 2011/0012677 A1 | 1/2011 | Dooper et al. | |
| 2011/0182435 A1 | 7/2011 | Gautama | |
| 2011/0193578 A1 | 8/2011 | Gautama | |
| 2011/0194705 A1 | 8/2011 | Gautama | |

FOREIGN PATENT DOCUMENTS

| | | |
|---|---|---|
| EP | 2 348 750 A1 | 7/2011 |
| WO | 2006/078378 A2 | 7/2006 |
| WO | 2009/077816 A1 | 6/2009 |
| WO | 2011/095952 A1 | 8/2011 |

OTHER PUBLICATIONS

Extended European Search Report for European Patent Appln. No. 10189200.8 (Apr. 13, 2011).
Maxim Integrated Products "Low RF Susceptibility, Mono Audio Subsystem with DirectDrive Headphone Amplifier, MAX9877", datasheet, 30 pgs. (2008).
NXP B.V. "TFA9881, 3.4 W PDM Input Class-D Audio Amplifier, Rev. 1, Preliminary Data Sheet", 32 pgs. (Jan. 5, 2011).
NXP B.V. "TFA9882, 3.4 W I2S Input Mono Class-D Audio Amplifier, Rev. 2, Product Data Sheet", 31 pgs. (Apr. 20, 2011).
Analog Devices Inc. "PDM Digital Input, Mono 2.4 W Class-D Audio Amplifier, SSM2517", datasheet, 16 pgs. (2011).

* cited by examiner

*Primary Examiner* — Lee Nguyen

(57)    ABSTRACT

An audio amplifier (3) for a mobile telephone (1) is disclosed. The audio amplifier (3) comprises first and second output stages (11, 12), each for coupling to a respective one of first and second loudspeakers (4, 5), and switching circuitry (10) adapted to respond to a switching signal by switching an output signal from a common input stage (7, 8, 9) to the first output stage (11) when the switching signal is in a first state and to the second output stage (12) when the switching signal is in a second state.

14 Claims, 2 Drawing Sheets

AUDIO AMPLIFIER

CROSS-REFERENCE TO RELATED APPLICATIONS

Figure 1:
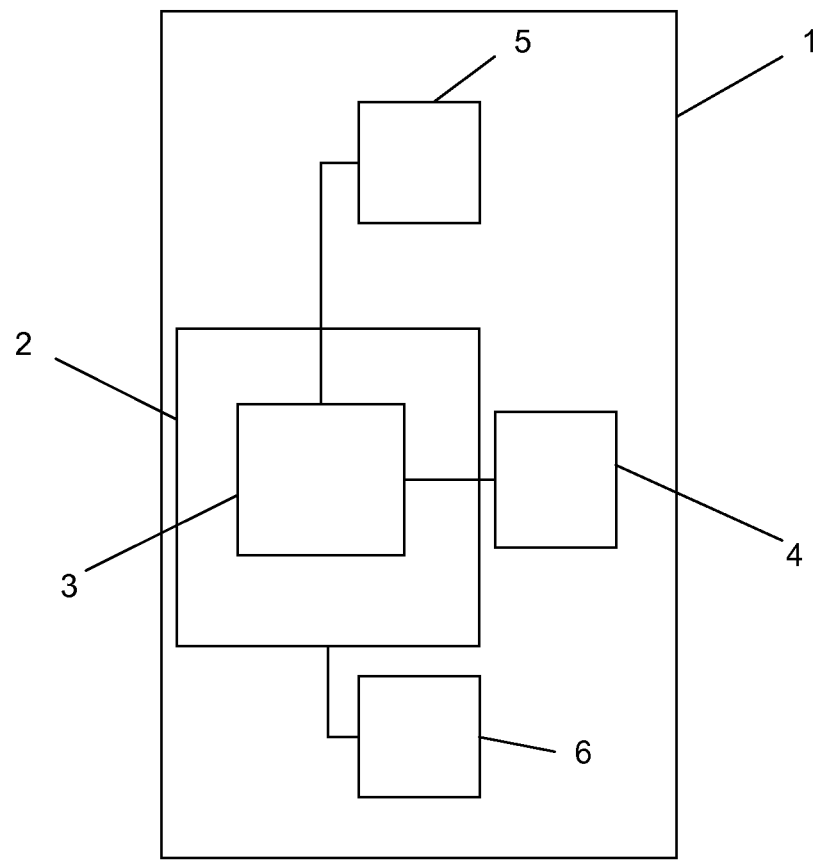

This application claims the priority under 35 U.S.C. §119 of European patent application no. 10189200.8, filed on Oct. 28, 2010, the contents of which are incorporated by reference herein.

The invention relates to an audio amplifier, and specifically to an audio amplifier for use with a mobile telephone.

It is common for mobile telephones to have two loudspeakers. The first (normally referred to as the main speaker) is a relatively high power loudspeaker used for playing back sounds at a high volume so that they are easily audible even when a user is some distance from the telephone. The main speaker is typically used for ringtones and for hands-free functions. The second loudspeaker (normally referred to as the receiver speaker) is a relatively low power loudspeaker used as the earpiece in a mobile telephone.

Current amplifier configurations make use of two separate channels (e.g. a stereo amplifier or two separate amplifiers) to drive each of these two speakers. However, this is wasteful because in a mobile telephone only one of these channels is in use at any one time.

According to a first aspect of the invention, there is provided an audio amplifier for a mobile telephone, the audio amplifier comprising first and second output stages, each for coupling to a respective one of first and second loudspeakers, and switching circuitry adapted to respond to a switching signal by switching an output signal from a common input stage to the first output stage when the switching signal is in a first state and to the second output stage when the switching signal is in a second state.

Hence, the invention overcomes the above-mentioned problem by providing a common input stage which can be switched by the switching circuitry to either of the first or second output stage, as required. Thus, each output stage can be adapted to suit the requirements of the associated loudspeaker to which it will be coupled in use and the signal processing circuitry is kept to a minimum. This of course reduces the cost and circuit board area occupied by the audio processing circuitry. In fact, when compared to a conventional single channel amplifier, this solution only includes a small amount of additional small-signal switching circuitry and a small output stage (the receiver speaker is only low power so the associated output stage only requires transistors of about ⅛ of the area of the main speaker output stage).

Typically, the common input stage comprises a pulse width modulator, whereby the output signal is a pulse width modulated output signal for driving either the first or second output stage. When the common input stage comprises a pulse width modulator, this will typically be for use with Class-D output stages. However, the invention can be used with any other type of output stage, such as Class-AB, Class-G or Class-H output stages.

Preferably, the pulse width modulator comprises a slew rate limiter for limiting the slew rate of the pulse width modulated output signal in response to a slew rate limiter enable signal. This is useful to reduce the electromagnetic interference (EMI) generated by the pulse width modulated output signal, albeit with a slight reduction in efficiency. The EMI can become significant if there are long tracks between the output stage and the loudspeaker.

Typically, the common input stage further comprises an I²S receiver, adapted to receive a digital data stream and decode the digital data stream to produce an audio input signal for modulation by the pulse width modulator. In other embodiments, the common input stage could comprise an interface for pulse density modulation (PDM), Slimbus or Time Division Multiplexed signals instead of the I²S receiver. Indeed, the invention could be used with an analogue input.

In a first embodiment, the audio amplifier further comprises a command decoder adapted to monitor one or more clock signals associated with the digital data stream and cause the switching signal to be in the first or second state in response to detecting a respective one of a first or second predefined pattern on the one or more clock signals.

In a second embodiment, the audio amplifier further comprises a command decoder adapted to monitor the digital data stream and one or more clock signals associated with the digital data stream and cause the switching signal to be in the first or second state in response to detecting a respective one of a first or second predefined pattern on the digital data stream and the one or more clock signals.

Preferably, the command decoder is further adapted to respond to detecting a third predefined pattern on the one or more clock inputs or on the digital data stream and the one or more clock inputs by asserting the slew rate limiter enable signal when the switching signal is in a predetermined one of the first and second states.

In a typical application, the high power main speaker is placed close to the associated output stage to reduce losses in the circuit board tracks caused by the relatively high currents involved, whereas the lower power receiver speaker is placed further away from its output stage. Thus, the EMI is generally only a concern for the receiver speaker and it is preferable to maintain the efficiency of the main speaker amplifier. Using this preferred embodiment, it is possible to make use of the slew rate limiting for the receiver speaker only, thereby reducing the EMI associated with the pulse width modulated signal for this speaker whilst maintaining high efficiency in the pulse width modulated signal for the main speaker.

In another embodiment, the switching signal is coupled to an input pin for coupling to circuitry remote from the audio amplifier such that the remote circuitry can control which of the first or second state the switching signal is in.

Preferably, the switching circuitry is adapted to couple the output of the first output stage to a feedback input of the pulse width modulator when the switching signal is in the first state and to couple the output of the second output stage to the feedback input of the pulse width modulator when the switching signal is in the second state.

In this way, it is necessary to provide only one feedback loop for both output stages.

Typically, the first and second output stages comprise transistors arranged in an H-bridge format. Other types of output stage may also be used, including single-ended output stages, such as half H-bridge output stages.

Normally, the first output stage is capable of generating a higher power output than the second output stage.

In accordance with a second aspect of the invention, there is provided a mobile telephone comprising an audio amplifier according to the first aspect of the invention, wherein the first output stage is coupled to a main speaker and the second output stage is coupled to an earpiece.

Figure 2:
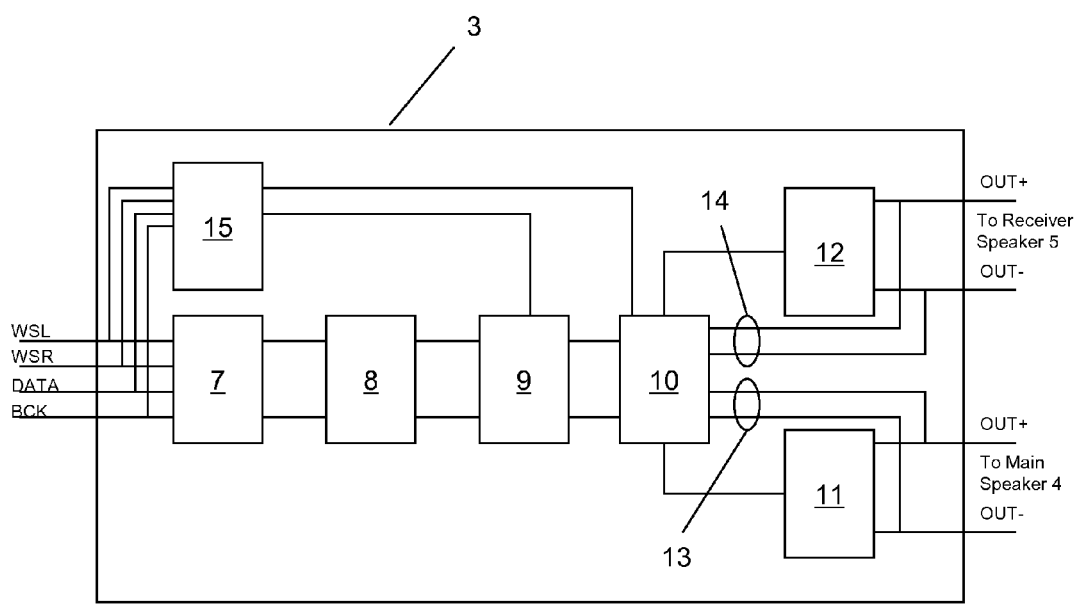

Examples of the invention will now be described in detail with reference to the accompanying drawings, in which:

FIG. 1 shows a block diagram of parts of a mobile telephone incorporating an amplifier according to the invention; and FIG. 2 shows a block diagram of an amplifier according to the invention.

FIG. 1 shows a block diagram of a mobile telephone 1. Within the mobile telephone 1, the baseband circuitry 2 is shown. This baseband circuitry 2 comprises an audio amplifier 3 according to an embodiment of the invention. The audio amplifier 3 is connected to the main speaker 4 and the receiver speaker (earpiece) 5. The baseband circuitry is also connected to a microphone 6, which together with receiver speaker 5 is used for telephone conversations.

As mentioned above, the main speaker 4 is a relatively high power speaker for playing ringtones, music and hands-free use. The receiver speaker 5 is a lower power speaker used as the mobile telephone's earpiece. The main speaker 4 is located relatively close to the audio amplifier 3, whereas the receiver speaker 5 is located a fair distance away from the audio amplifier 3.

FIG. 2 shows a block diagram of audio amplifier 3. The audio amplifier 3 comprises an I²S receiver 7, which is coupled to a high-pass filter 8, which in turn is coupled to a pulse width modulator 9. The I²S receiver 7 receives a serial digital data stream on the line labeled DATA. The digital data stream is clocked into the I²S receiver 7 at the rate of a bit clock on the line labeled BCK. The digital data stream is capable of carrying data representing two audio channels multiplexed into the stream, the audio channel being demultiplexed using two clock signals WSL and WSR, which together indicate which of the two channels is currently being carried on the stream.

The I²S receiver 7 decodes the digital data stream and converts it into an analogue signal, which is passed to the high-pass filter 8. This removes any DC components from the analogue signal. The filtered analogue signal is then passed to a pulse width modulator 9. The pulse width modulator 9 converts the analogue signal into a pulse width modulated signal suitable for driving a class-D audio output stage.

The pulse width modulated signal is supplied to switching circuit 10. This couples the pulse width modulated signal either to output stage 11, which drives the main speaker 4, or to output stage 12, which drives the receiver speaker 5.

Each of the output stages 11 and 12 is an H-bridge type of output stage and has a non-inverting output (OUT+) and an inverting output (OUT−). The non-inverting output and inverting output associated with each stage are coupled back to the switching circuit 10. The switching circuit 10 couples either the pair of outputs associated with output stage 11 (shown as 13 in FIG. 2) or the pair of outputs associated with output stage 12 (shown as 14 in FIG. 2) back to feedback circuitry within pulse width modulator 9. In this way, appropriate negative feedback can be provided for each output stage 11 and 12.

The audio amplifier 3 also comprises a command decoder 15. The command decoder 15 monitors the clock and data stream inputs to the I²S receiver 7 and responds in a predetermined manner when a predefined pattern is detected on those inputs. The response to a first predefined pattern may be to cause the switching circuit to couple the output of the pulse width modulator to output stage 11 (and the outputs 13 from output stage 11 back to the feedback circuitry within switching circuit 10). Alternatively, the response to a second predefined pattern may be to cause the switching circuit to couple the output of the pulse width modulator to output stage 12 (and the outputs 14 from output stage 12 back to the feedback circuitry within switching circuit 10). In another alternative, the response to a predefined pattern may be to toggle the output of the pulse width modulator between the output stages 11 and 12 (and also to toggle which of the associated outputs 13 and 14 is coupled to the feedback circuitry within switching circuit 10).

The predefined patterns detected by the command decoder 15 may be of several categories. In a first category, the command decoder 15 ignores the data present on the DATA input, but monitors the frequencies on each of the clock inputs BCK, WSL and WSR. When the pattern of frequencies on the clock inputs BCK, WSL and WSR is such that each has a respective predefined value or falls within a respective predefined range of values then this is interpreted by the command decoder 15 as a command associated with that pattern of frequencies. For example, if the frequency on the BCK input is within the range of 2.048 MHz to 3.072 MHz while the frequency on each of the WSL and WSR inputs is 0 Hz then this may be interpreted as a command for toggling the switching circuit 10 as described above.

In a second category, the command decoder 15 monitors the frequency on the BCK input. When it drops to 0 Hz, the audio amplifier 3 enters a power-down mode. When the clock frequency on the BCK input resumes, the audio amplifier 3 enters an operating mode again. During a predefined number of cycles on the BCK input after entering the operating mode, the command decoder 15 monitors the DATA input for specific predefined patterns. For example, one such pattern may be interpreted as a command for toggling the switching circuit 10 as described above. Thus, in this second category, the pattern that is looked for is the resumption of clock cycles on the BCK input along with a specific data pattern on the DATA input. The specific data pattern will typically be a predefined number of consecutive repetitions of a predefined byte. The predefined byte may comprise four binary ones and four binary zeros.

In a third category, the command decoder 15 monitors the DATA input for a specific predefined pattern, typically a predefined number of consecutive repetitions of a predefined byte. However, in this category the pattern is detected during normal operation of the audio amplifier (i.e. not during a power-up sequence as in the second category) when the BCK input is receiving clock cycles as normal.

Another type of command that may be decoded by the command decoder 15 is for controlling the slew rate of the pulse width modulator 9. As explained above, it is beneficial to limit the slew rate for the receiver speaker channel because the circuit board tracks between the output stage 12 and the receiver speaker 5 are relatively long and high slew rates on these tracks causes significant EMI. Reduction of the slew rate reduces the EMI considerably. On the other hand, it is desirable not to limit the slew rate for the relatively high power main speaker 4 as this would reduce the efficiency too much. In any event, the main speaker 4 is located close to the output stage 11 and so the opportunity for generating EMI is already much reduced.

Thus, when the command for limiting the slew rate of the pulse width modulator 9 is received by the command decoder 15, it asserts an input on the pulse width modulator 9 that causes it to limit the slew rate of the pulse width modulated output. However, this input is only asserted when the command causing the switching circuit 10 to select or toggle to the output stage 12 is received. When a command causing the switching circuit 10 to select or toggle to the output stage 11 is received then the command decoder 15 negates the input on the pulse width modulator 9 that causes it to limit the slew rate. In this way, the pulse width modulator 9 only limits its slew rate when the receiver speaker 5 channel is selected. Another command may be used to cancel the slew rate limiting behaviour (or the same command may be used to toggle the slew rate limiting behaviour).

Other variations to the disclosed embodiments can be understood and effected by those skilled in the art in practising the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measure cannot be used to advantage. Any reference signs in the claims should not be construed as limiting the scope.

The invention claimed is:

1. An audio amplifier for a mobile telephone, the audio amplifier comprising:
   first and second output stages, each output stage configured to be coupled to a respective one of first and second loudspeakers;
   switching circuitry configured to respond to a switching signal by switching an output signal from a common input stage to the first output stage when the switching signal is in a first state and to the second output stage when the switching signal is in a second state; and
   a command decoder configured to monitor clock and data inputs to the common input stage.

2. The audio amplifier according to claim 1, wherein the common input stage comprises a pulse width modulator, whereby the output signal is a pulse width modulated output signal for driving either the first output stage or the second output stage.

3. The audio amplifier according to claim 2, wherein the switching circuitry is configured to couple the output of the first output stage to a feedback input of the pulse width modulator when the switching signal is in the first state and couple the output of the second output stage to the feedback input of the pulse width modulator when the switching signal is in the second state.

4. The audio amplifier according to claim 2, wherein the common input stage further comprises:
   an I²S receiver, configured to receive a digital data stream and decode the digital data stream to produce an audio input signal for modulation by the pulse width modulator.

5. The audio amplifier according to claim 4, wherein the command decoder is configured to cause the switching signal to be in one of the first and the second state in response to detecting a respective one of a first and a second predefined pattern on the clock input.

6. The audio amplifier according to claim 5, wherein the command decoder is further configured to respond to detecting a third predefined pattern on the clock input or on the data input and the clock input by asserting the slew rate limiter enable signal when the switching signal is in a predetermined one of the first and the second states.

7. The audio amplifier according to claim 4, wherein the command decoder is configured to cause the switching signal to be in one of the first and the second state in response to detecting a respective one of a first or a second predefined pattern on the data input and the clock input.

8. The audio amplifier according to claim 1, wherein the switching signal is coupled to an input pin for coupling to circuitry remote from the audio amplifier such that the remote circuitry can control which of the first and the second state the switching signal is in.

9. The audio amplifier according to claim 1, wherein the first and the second output stages comprise transistors arranged in an H-bridge format.

10. The audio amplifier according to claim 1, wherein the first output stage is capable of generating a higher power output than the second output stage.

11. A mobile telephone comprising the audio amplifier according to claim 1, wherein the first output stage is coupled to a main speaker and the second output stage is coupled to an earpiece.

12. The audio amplifier of claim 1, wherein the command decoder monitors a frequency on a BCK input.

13. The audio amplifier of claim 12, wherein the audio amplifier enters a power-down mode when the frequency on the BCK input drops to 0 Hz.

14. An audio amplifier for a mobile telephone, the audio amplifier comprising:
   first and second output stages, each output stage configured to be coupled to a respective one of first and second loudspeakers, and
   switching circuitry configured to respond to a switching signal by switching an output signal from a pulse width modulator to the first output stage when the switching signal is in a first state and to the second output stage when the switching signal is in a second state, whereby the output signal is a pulse width modulated output signal for driving either the first output stage or the second output stage, and wherein the pulse width modulator comprises a slew rate limiter for limiting the slew rate of the pulse width modulated output signal in response to a slew rate limiter enable signal.

* * * * *